(12) United States Patent
Chaji et al.

(10) Patent No.: US 11,916,096 B2
(45) Date of Patent: Feb. 27, 2024

(54) CIRCUIT AND SYSTEM INTEGRATION ONTO A MICRO-DEVICE SUBSTRATE

(71) Applicant: VueReal Inc., Waterloo (CA)

(72) Inventors: Gholamreza Chaji, Waterloo (CA); Yaser Azizi, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 17/002,514

(22) Filed: Aug. 25, 2020

(65) Prior Publication Data

US 2020/0388597 A1    Dec. 10, 2020

Related U.S. Application Data

(62) Division of application No. 15/892,523, filed on Feb. 9, 2018.

(Continued)

(51) Int. Cl.
| | | |
|---|---|---|
| *H01L 27/15* | (2006.01) | |
| *G06F 3/041* | (2006.01) | |
| *H01L 25/075* | (2006.01) | |
| *H01L 27/12* | (2006.01) | |
| *H01L 33/40* | (2010.01) | |

(Continued)

(52) U.S. Cl.
CPC .......... *H01L 27/156* (2013.01); *G06F 3/0412* (2013.01); *H01L 25/0753* (2013.01); *H01L 27/1244* (2013.01); *H01L 33/405* (2013.01); *H01L 33/50* (2013.01); *H01L 33/60* (2013.01); *H01L 33/62* (2013.01); *H01L 2933/0066* (2013.01)

(58) Field of Classification Search
CPC ............. H01L 25/0753; H01L 27/1244; H01L 33/405; H01L 33/50; H01L 33/60; H01L 33/62; H01L 2933/0066; H01L 33/48; H01L 33/52; H01L 27/32; H01L 27/3237; H01L 27/3246; H01L 27/3255; H01L 27/326; H01L 27/3276; H01L 27/3251; H01L 27/3253; H01L 27/15; H01L 27/156; G06F 3/0412
See application file for complete search history.

(56) References Cited

U.S. PATENT DOCUMENTS 5,501,990 A    3/1996    Holm
7,482,667 B2   1/2009    Guidotti
(Continued)

OTHER PUBLICATIONS

International Search Report and Written Opinion in International Patent Application No. PCT/IB2019/059903, dated Feb. 24, 2020 (18 pages).

*Primary Examiner* — Eduardo A Rodela
(74) *Attorney, Agent, or Firm* — Nixon Peabody LLP

(57) ABSTRACT

An integrated optical display system includes a backplane with appropriate electronics, and an array of micro-devices. A touch sensing structure may be integrated into the system. In one embodiment, an integrated circuit and system is integrated on top of micro-devices transferred to a substrate. Openings in a planarization layer (or layers) may be provided to connect the micro-devices with electrodes and other circuitry. Light reflectors may be used to redirect the light, and color conversion layers or color filters may be integrated before the micro-devices or on the substrate surface opposite to the surface of micro-devices.

10 Claims, 20 Drawing Sheets

Related U.S. Application Data

(60) Provisional application No. 62/456,739, filed on Feb. 9, 2017, provisional application No. 62/482,939, filed on Apr. 7, 2017.

(51) Int. Cl.
*H01L 33/50* (2010.01)
*H01L 33/60* (2010.01)
*H01L 33/62* (2010.01)

(56) References Cited

U.S. PATENT DOCUMENTS

| | | | |
|---|---|---|---|
| 7,884,543 B2 | 2/2011 | Doi | |
| 8,680,552 B2* | 3/2014 | Cho | H01L 33/486 |
| | | | 257/98 |
| 9,111,949 B2 | 8/2015 | Yu | |
| 9,190,451 B2* | 11/2015 | Hung | H01L 27/156 |
| 9,865,832 B2* | 1/2018 | Bibi | H01L 27/3244 |
| 9,978,728 B2 | 5/2018 | Lin et al. | |
| 9,991,163 B2 | 6/2018 | Bower | |
| 10,084,009 B2 | 9/2018 | Kim | |
| 10,395,594 B1* | 8/2019 | Charisoulis | G09G 3/3258 |
| 10,437,402 B1 | 10/2019 | Pan | |
| 10,593,743 B2 | 3/2020 | Son | |
| 10,606,393 B2 | 3/2020 | Cheng | |
| 10,818,819 B2 | 10/2020 | Tsai et al. | |
| 10,902,756 B2 | 1/2021 | Choi | |
| 11,641,008 B2 | 5/2023 | Lee et al. | |
| 2004/0184270 A1* | 9/2004 | Halter | H01L 33/60 |
| | | | 362/296.04 |
| 2007/0029554 A1* | 2/2007 | Nakamura | H01L 27/3288 |
| | | | 257/E27.111 |
| 2007/0035241 A1* | 2/2007 | Abe | H01J 1/74 |
| | | | 313/506 |
| 2007/0176863 A1* | 8/2007 | Oh | H01L 27/3253 |
| | | | 345/82 |
| 2007/0284752 A1 | 12/2007 | Lin | |
| 2009/0115705 A1* | 5/2009 | Miller | G09G 3/3208 |
| | | | 345/76 |
| 2012/0256814 A1 | 10/2012 | Ootorii | |
| 2014/0367633 A1* | 12/2014 | Bibl | H01L 27/3246 |
| | | | 257/13 |
| 2015/0362165 A1 | 12/2015 | Chu | |
| 2016/0276329 A1* | 9/2016 | Bono | H01L 33/644 |
| 2016/0293586 A1 | 10/2016 | Ghosh | |
| 2016/0372514 A1 | 12/2016 | Chang | |
| 2017/0269749 A1* | 9/2017 | Bok | H01L 27/3262 |
| 2017/0358505 A1 | 12/2017 | Chang | |
| 2018/0145225 A1 | 5/2018 | Perzlmaier | |
| 2018/0212051 A1* | 7/2018 | Wu | H01L 27/1251 |
| 2018/0315738 A1 | 11/2018 | Bono | |

* cited by examiner

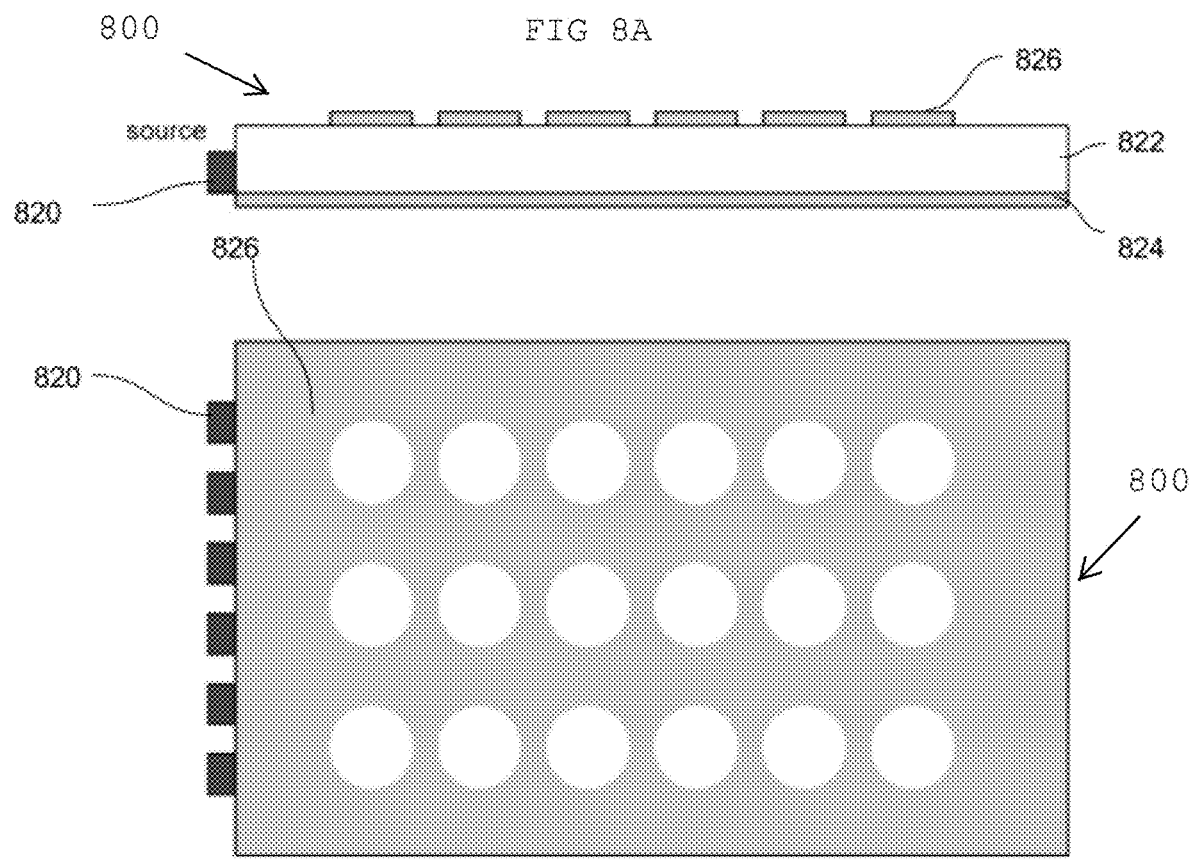
FIG 8A
FIG 8B
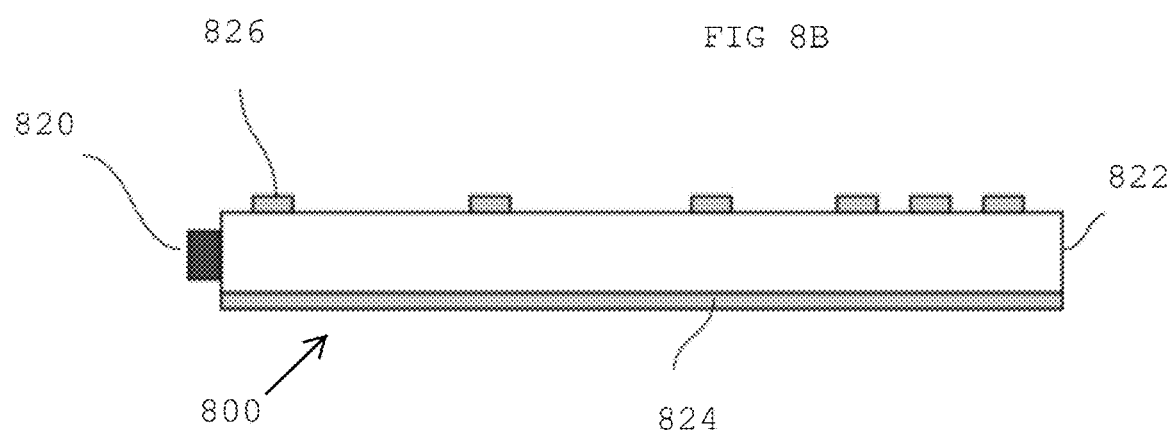
FIG 8C

CIRCUIT AND SYSTEM INTEGRATION ONTO A MICRO-DEVICE SUBSTRATE

CROSS REFERENCE TO RELATED APPLICATIONS

This application is a division of U.S. Nonprovisional application Ser. No. 15/892,523, filed Feb. 9, 2018, entitled "Circuit and System Integration onto a Micro-Device Substrate," which claims priority to and the benefit of U.S. Provisional Application Nos. 62/456,739, filed Feb. 9, 2017, and 62/482,939, filed Apr. 7, 2017, each of which is incorporated herein by reference in its entirety.

TECHNICAL FIELD

The present disclosure relates to the integration of circuits and systems into a micro-device substrate.

BACKGROUND

One method to improve the system performance is to integrate micro-devices into a system substrate. The challenge is to transferring millions of these devices and integrate them with circuits for every pixel with proper yield.

An object of the present invention is to overcome the shortcomings of the prior art by providing micro-devices integrated with circuits.

SUMMARY

A few embodiments of this description are related to integration of circuits and systems in micro-device substrate. The micro-device substrate may comprise micro light emitting diodes (LEDs), Organic LEDs, sensors, solid state devices, integrated circuits, (micro-electro-mechanical systems) MEMS, and/or other electronic components.

One embodiment includes light sources sandwiched between two reflective layers with at least one is a patterned reflective layer. The patterned reflective layer may have a profiled pattern to improve the light output uniformity. There may be other layer between the device and reflective layers.

The receiving substrate may be, but is not no limited to, a printed circuit board (PCB), thin film transistor backplane, integrated circuit substrate, or, in one case of optical micro devices such as LEDs, a component of a display, for example a driving circuitry backplane. The patterning of micro device donor substrate and receiver substrate may be used in combination with different transfer technologies, including but not limited to pick and place with different mechanisms, e.g. electrostatic transfer head and elastomer transfer head, or direct transfer mechanisms, such as dual function pads and more.

BRIEF DESCRIPTION OF THE DRAWINGS

The invention will be described in greater detail with reference to the accompanying drawings which represent preferred embodiments thereof, wherein:

FIG. 8A shows a light guide based on two reflective layers with one being patterned.

FIG. 8B shows a patterned reflective layer with gradient profile.

FIG. 8C shows a light guide based on two reflective layers with one being patterned according to another pattern.

Figure 1:
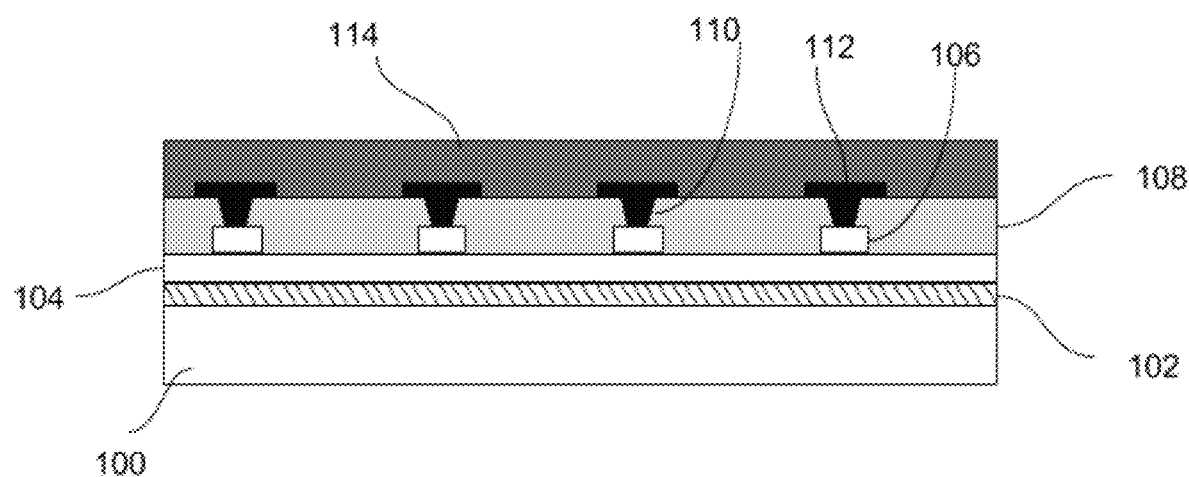
FIG. 1 shows a cross section of a system based on integration of circuit to a receiver substrate with integrated micro devices.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

In this disclosure, pads in a receiver substrate may refer to a designated area in receiver substrate to where a micro device is transferred. The pads may be conductive to prepare connection between the micro device and the pixel circuits or connections where the pixel circuits may be underneath the pad or on the side of the pad. The pad may have some form of bonding materials to hold the micro device permanently. The pad may be stack of multi layer to offer more mechanically stable structure and also better functions, such as bonding and conductivity capability.

The pads in this description may either provide an electrical connection, or a mechanical connection or just a defined area for transferring micro devices. The shape of pads used in the embodiments are for purpose of illustration and may have any arbitrary shape. The position of pads in respect to the pixels may be changed without any affect on the embodiments. The orientation of the group of pads in the pixel may be changed. For example, they may be rotated, shifted or moved to different position. The pads may have complex structure comprising different conductive, semiconductor and/or dielectric layers. The pads may be positioned on top of other structures, such as transistors in the receiver substrate. Also, the pads may be beside other structures on the receiver substrates.

The shape of light sources used in the embodiments are for purpose of illustration and devices may have different shapes. The light source devices may have one or more pads on side that will contact the receiver substrate. The pads may be mechanical, electrical or combination of both. The one or more pads may be connected to common electrode or row/column electrodes. The electrodes may be transparent or opaque. The light sources may have different layers. The light sources may be comprised of different material such as organic, inorganic, or combination of them.

With reference to FIG. 1, an embodiment of the present invention, comprises a substrate 100, a bottom electrode 104, micro-devices 106, top electrodes 112, and an integrated circuit layer 114. A buffer layer 102 may be deposited between the substrate 100 and the bottom electrode 104. The buffer layer (or layers) 104 may be used as delamination layer, as well as for separating the fully integrated system from the substrate 100. The buffer layer 102 may be eliminated, especially when the stacked micro-devices 106 and the circuit layer structure 114 is remaining on the substrate 100. The bottom electrode 104 may be deposited on the substrate 100, and may be patterned for individual micro-devices 106 or be used as a common electrode for all of the micro-devices 106. Some extra layers may be deposited on top of the bottom electrode 104 to create bonding places for the micro-devices 106. Prior to the micro-devices 106 being transferred onto the substrate 100, a planarizing layer 108 is developed over the bottom electrode 104, and over and around the micro-devices 106. It is possible that the planarizing layer 108 is comprised of a few different layers and materials, e.g. dielectric. Openings 110 are then formed, e.g. etched, into the planarizing layer 108 down to each micro-device 106. The backplane may then be mounted on the micro-device structure by first disposing or forming top electrodes 112 in the openings 110, whereby the top electrodes 112 may be connected to the micro device 106. The top electrodes 112 may then be used to connect the micro device 106 to an integrated circuit layer 114 interconnecting each of the micro devices 106, via the top electrodes 112, to external power and control systems. The integrated circuit layer 114 may be either thin film transistors, CMOS chiplet, or other type of integrated circuit. The common electrode 104 may be ignored, if there is no connection for the micro-device 106 to a common voltage level. Before or after deposition of the buffer layer 102, a touch sensing structure may be placed over the micro-devices 106. The touch sensing structure may be separated from the micro-devices 106 and or their electrode(s) 112 by a dielectric layer. The touch structure may be in the same plane as the micro devices 106. The touch structure may comprise any type, such as capacitive, resistive, pressure, optical or a combination thereof.

Figure 2A:
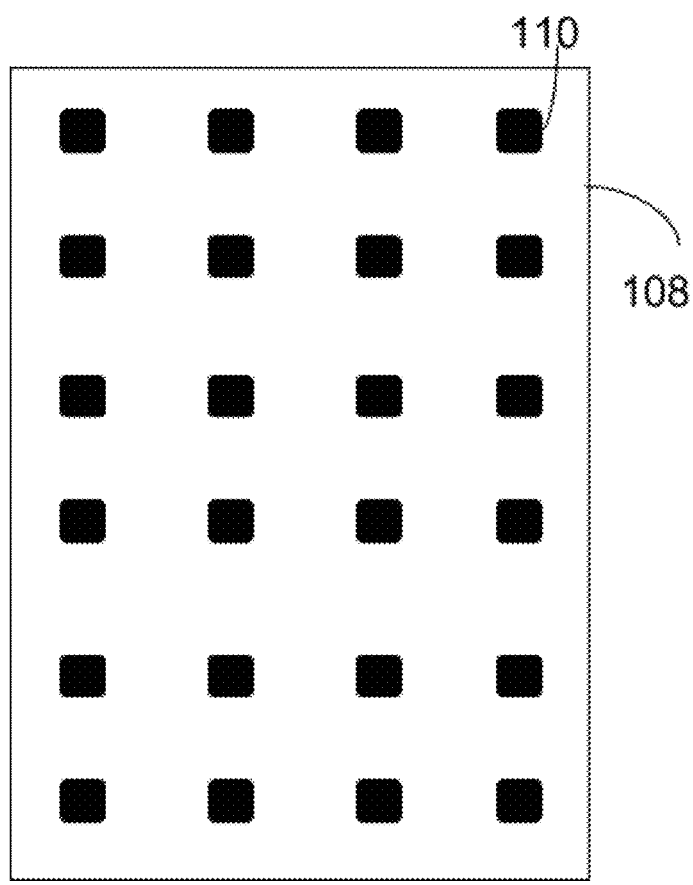
FIG. 2A shows a top view of the receiver substrate with opening to the micro devices.

FIG. 2A illustrates a top view of the planarizing layer 108. The openings 110 extending through the planarizing layer 108 may be used to receive the top electrodes 112 for connecting to the micro-devices 106 to the integrated circuit layer 114. The number of opening 110 for each micro-device 106 depends on the number of connections required between the micro-device 106 and the integrated circuit layer 114.

Figure 2B:
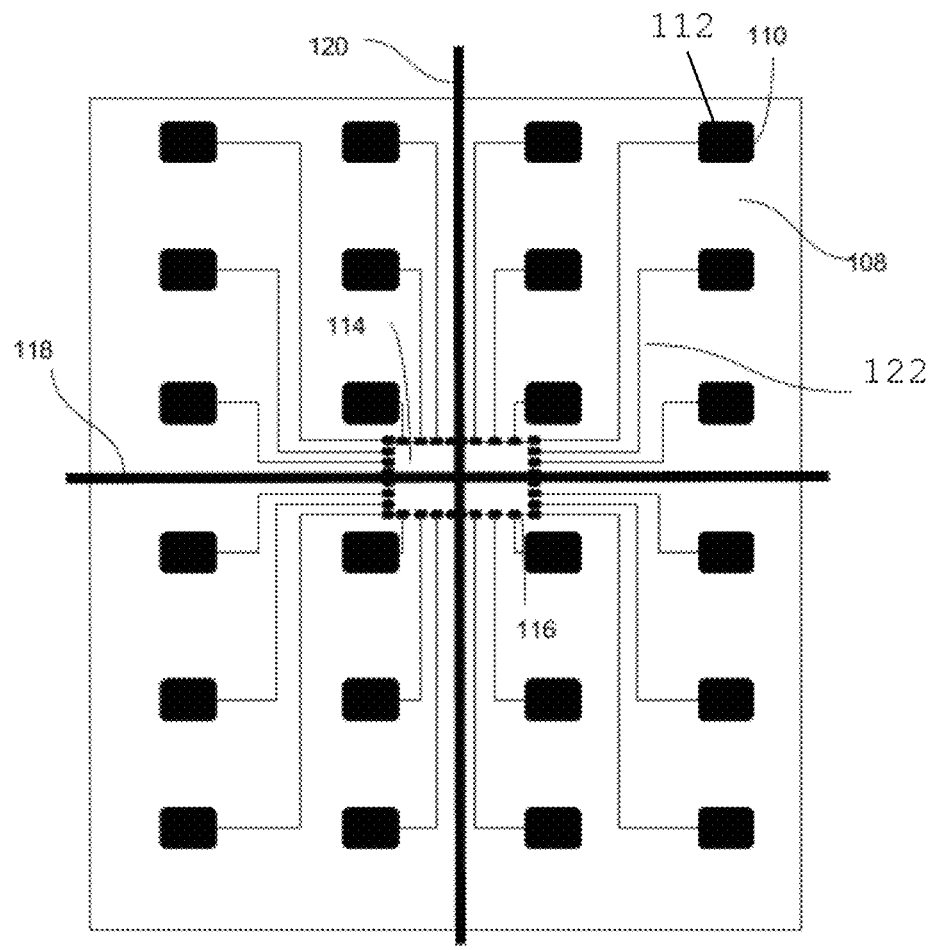
FIG. 2B shows a receiver substrate with micro device and integrated circuits.

FIG. 2B illustrates connection between the backplane, i.e. the integrated circuit layer 114, and the micro-devices 110. Trace circuits 122 extend from the top electrodes 112 in the openings 110 to a pad 116 in the integrated circuit layer 114. There may be common electrodes, e.g. electrodes 120 and 118. The common electrodes 118 and 120 may be directly connected to the top electrodes 112 or the circuit may extend through the trace circuits 122 to avoid any short in the crossing. The integrated circuit layer 114, e.g. the backplane, may be fabricated after the planarizing layer 108, and the backplane may be comprised of a thin film transistor (TFT) layer.

In alternative embodiments, other layers, such as color conversion, color filter, or other devices may be included, e.g. deposited, between the substrate 100 and the micro device 106. In another embodiment, light distribution layers may be integrated between the micro-devices 106 and the other layers, e.g. integrated circuit layer 114, on top of the micro-devices 106. In another embodiment, other structures, such as a color conversion layer, color filter or other devices may be placed on the underside of substrate 100, opposite to the side where the micro-devices 106 are located. In another embodiment, the bottom electrode 104 may be a distribution layer.

Figure 3:
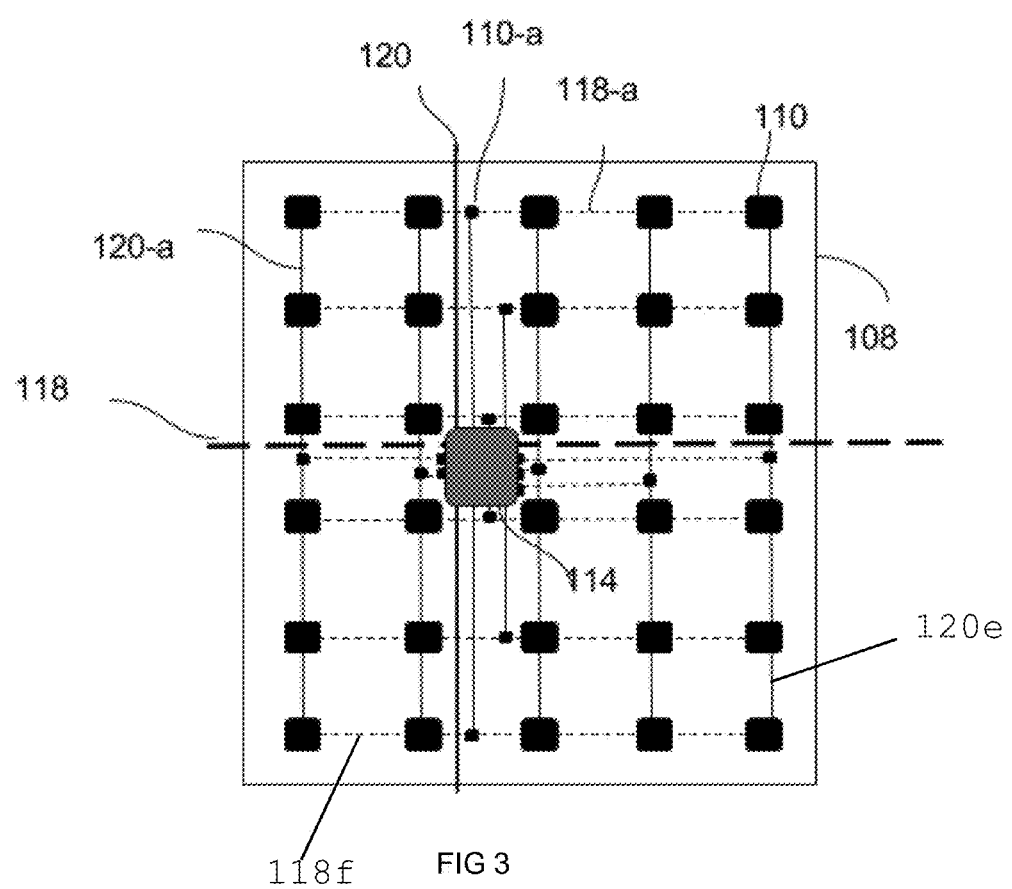
FIG. 3 shows another exemplary structure of integrating circuits into the receiver substrate with micro devices.

With reference to FIG. 3, a receiver structure 108 includes a plurality of the micro devices 106 formed into an array of rows and columns, which are connected with row electrodes 118a-118f and column electrodes 120a to 120e. The driving and controlling integrated circuit 114 is connected to the columns 120a-120e and rows 118a-118f to drive the micro devices 106. The connection is down through connection via openings 110a in the planarizing layer 108. There may also be general column electrodes 118 and row electrodes 120 for the driving integrated circuit layer 114.

Figure 4A:
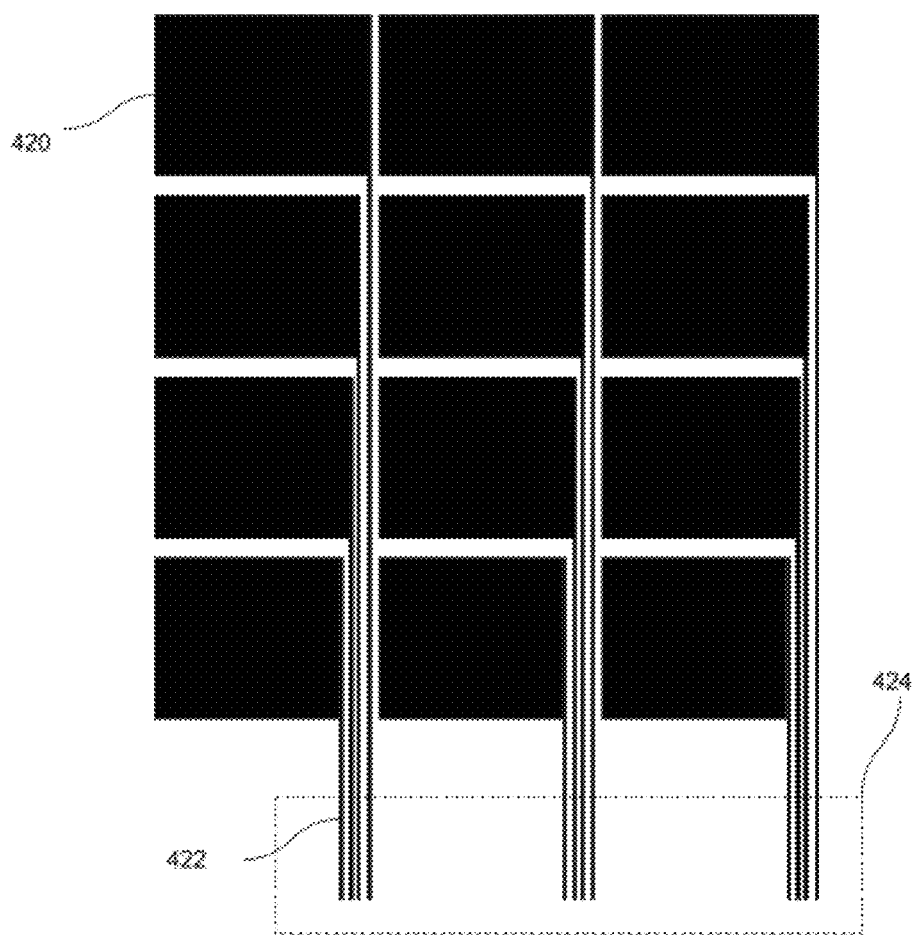
FIG. 4A shows an embodiment of connecting devices in localized integration area to a circuit in an opening.

FIG. 4A illustrates a floor plan for integrating microdevices 106 into a backplane integrated circuit layer 114, and for providing access to a controllable electrode for the micro devices 106. The floor plan includes an integration area 420 which can include pads, landing area, and other structures, and at least one controllable electrode 422. In one embodiment, the controllable electrode 422 and the integration area 420 are transparent enabling light to pass through them for use in particular optoelectronic devices. In another embodiment, for certain optoelectronic devices, the controllable electrode 422 is extended between two columns (rows or adjacent micro devices 106) to an open area 424, where a driver may be integrated. Here, the controllable electrode 422 may be reflective to direct light toward and through the bottom layers, e.g. transparent bottom electrode 104. Although this structure is useful for some applications, such as integration of micro-LED for lighting, it may be a challenge due to structural non-uniformity for applications, such as backlight units for display applications. FIG. 4B illustrates a structure including an additional continuous reflector layer 426 on top of the integrated circuit layer 114, and a patterned transparent integration area 422. The continuous reflector layer 426 enables more uniform light extraction.

Figure 4:
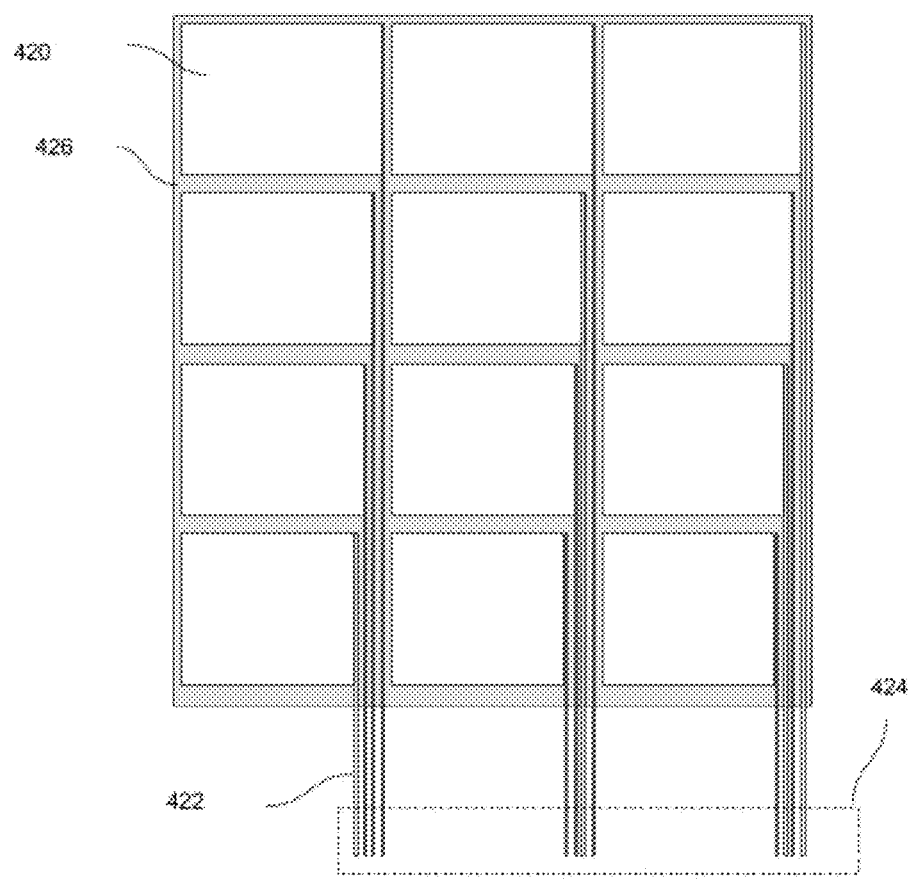
FIG. 4B shows an embodiment of connecting devices in localized integration area to a circuit in an opening which incorporate a reflective layer.
FIG. 4C shows a cross section of an embodiment with micro devices and reflective layers.
FIG. 4D shows another example of a cross section of an embodiment with micro devices and reflective layers.
FIG. 4E shows another example with balanced optical structure.
Figure 4C:
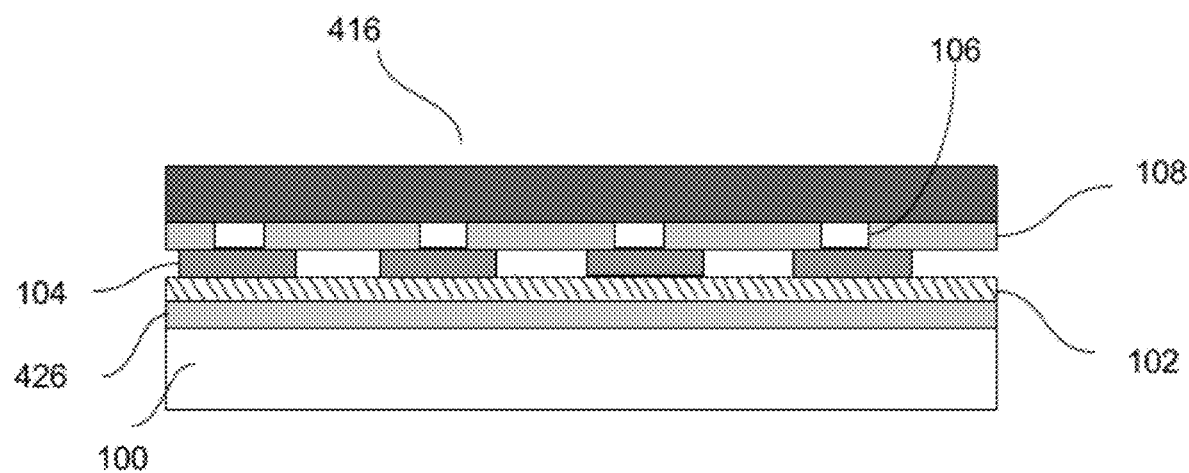
Figure 4D:
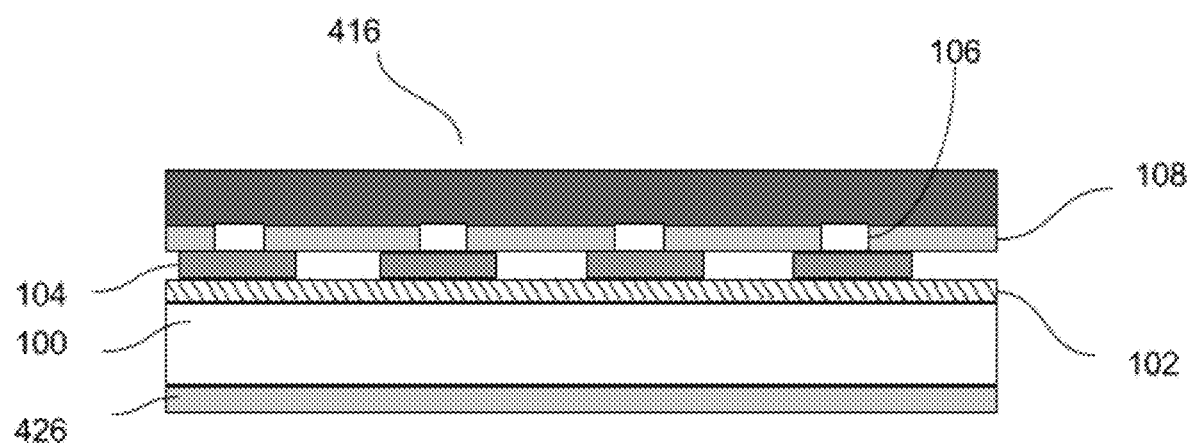
Figure 4E:
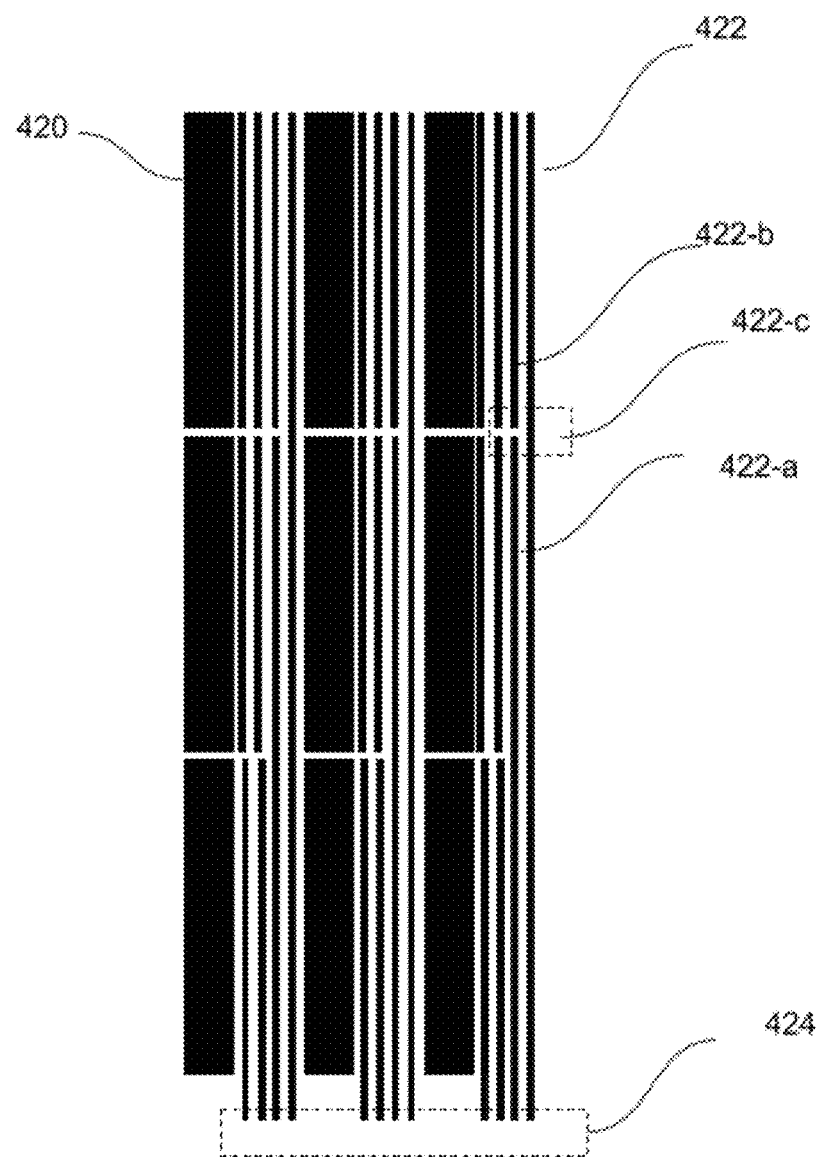

FIG. 4C illustrates a cross sectional view of one exemplary embodiment of FIGS. 4A-B. The reflective layer 426 may be deposited or transferred onto the substrate 100 and then the buffer layer (or dielectric) 102 may be deposited on top of the reflective layer 426. Another buffer layer(s) or other structures may be deposited before the reflective layer 426. In the exemplary embodiment of FIG. 4D, the reflective layer 426 may be deposited on the other side of the substrate 100, i.e. opposite the bottom electrodes 104 and microdevices 106. In the illustrated embodiments of FIGS. 4C and 4D, the bottom electrodes 104 are patterned for each microdevice 106, while the top electrode 416 is a single common electrode, either of which may be transparent or reflective. On both the structures of FIGS. 4C and 4D other layers may be deposited after the micro device 106 integration, such as the filler or planarizing layer 108 around the micro-devices 108, and the top electrode 416. Other layers may be included in the top electrode layer 416, such as color conversion. In an exemplary structure, illustrated in FIG. 4E, the integration area 420 and the electrodes 422 are shaped to be the same across all areas. Here, the electrodes 422 are extended across the active area and to avoid shorting the devices 106, some electrode have at least one opening 422-c to disintegrate the active 422-a part of the electrode from the inactive part 422-b, which is there for uniformity. Accordingly, active and inactive electrodes 422-a and 422-b, respectively, are used to balance the optical uniformity of the local array and controlling electrode structure.

Figure 5A:
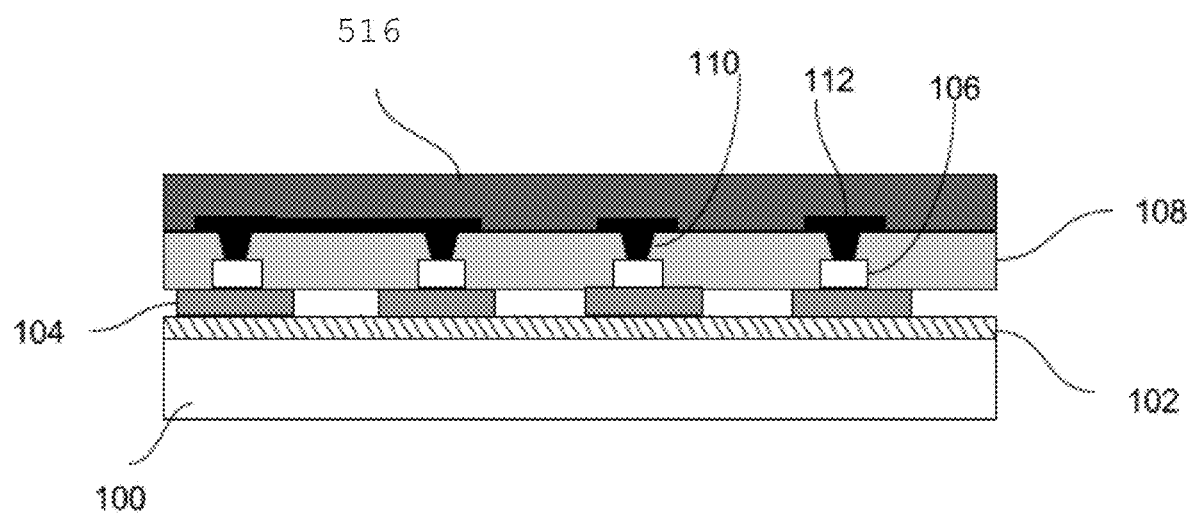
FIG. 5A shows a cross section of an example integrating top structure to the receiver substrate with the micro devices.
Figure 5B:
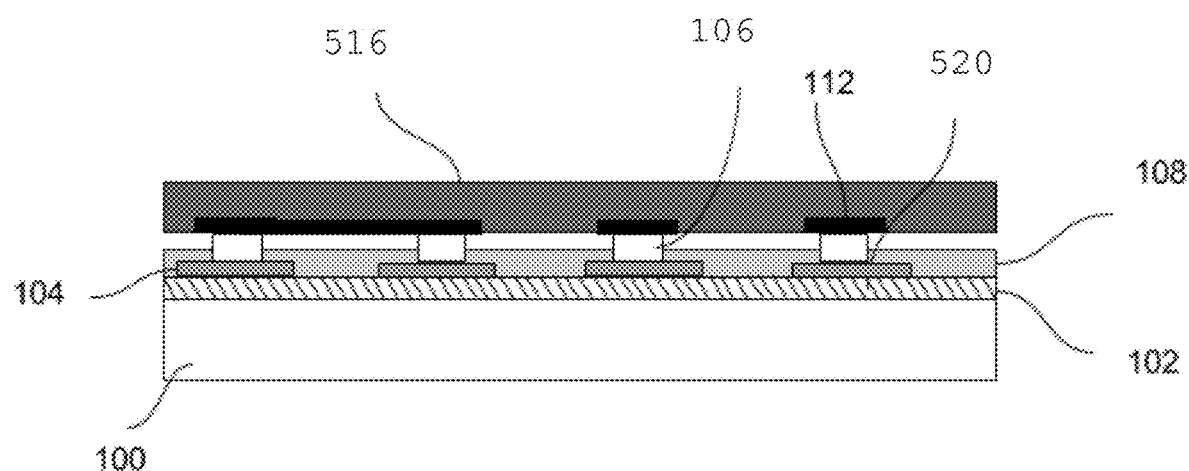
FIG. 5B shows a cross section of another example of integrating top structure to the receiver substrate with micro devices.
Figure 5C:
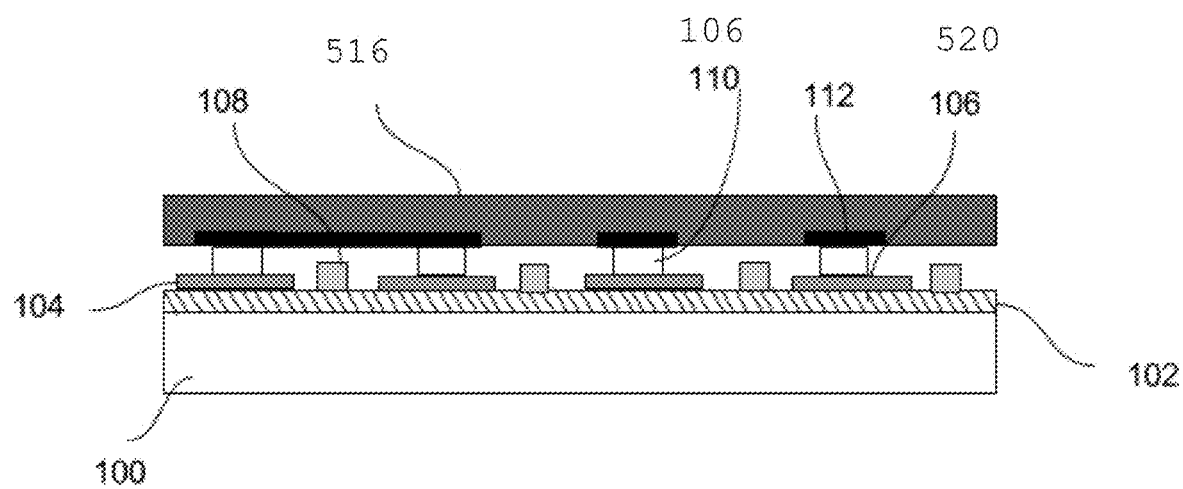
FIG. 5C shows a cross section of another example of integrating top structure to the receiver substrate with micro devices.
Figure 5D:
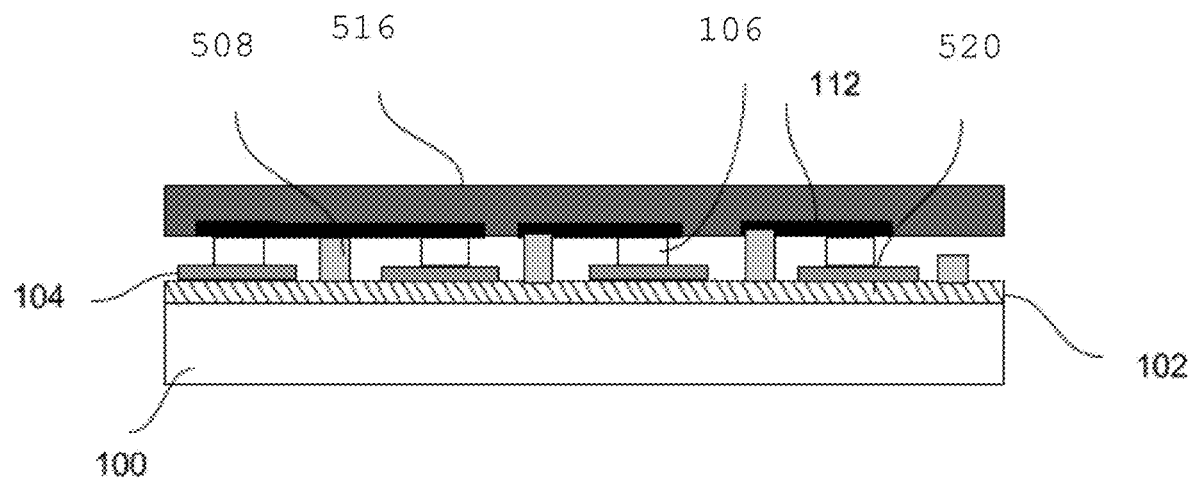
FIG. 5D shows a cross section of another example of integrating top structure to the receiver substrate with micro devices.

A challenge for low cost application is the integration of other structures, such as top electrodes 112, into the receiver substrate 100 with integrated micro devices 106. One method is deposition process as shown in FIG. 5A, as hereinbefore discussed with reference to FIGS. 1 and 4. However, this process may be expensive and require expensive and large equipment. Another method is printing. FIG. 5B illustrates a structure for laminating the top structure 516 including the top electrodes 112. Here, the top structure 516 is fabricated separately with different methods. The receiver substrate 100 with integrated micro devices 106 may be insulated with a filler layer 108, but the filler layer 108 does not cover the micro-devices 106, so the exposed microdevices extend upwardly from the filler layer 108, eliminating the need for openings 110, and enabling connection to the top electrodes 112. The top structure 516 may then be laminated to the receiver substrate 100. The pads 520 on the receiver substrate 100 or the top structure 516 have layers to provide electrical contact due to pressure and temperature applied during lamination. The materials may be alloyed or annealed to create the electrical conduction pads 520. In another embodiment, further annealing steps may be used after lamination process. The filler layer 108 may be either deposited or printed onto the receiver substrate 100. In other exemplary structure, demonstrated in FIG. 5C, individual spacers 508 are used on the receiver substrate 100 between micro devices 106, instead of a full filler layer 208. The spacers 508 may include a dielectric or insulating material, thereby eliminating the possibility of shorting the structures on the top structure 516 to unwanted areas on the receiver substrate 100. As illustrated in FIG. 5D, the spacers 508 may extend to the same height of the micro devices 106, e.g. the same height as the bottom electrode 104 and the micro-devices combined, whereby the spacers 508 extend upwardly from the substrate 100 substantially the same distance as the micro-devices 106, so that the spacers 508 may also support the to structure 516. Here, the position of top structure 516 and bottom substrate 100 may be changed without affecting the performance.

Figure 6A:
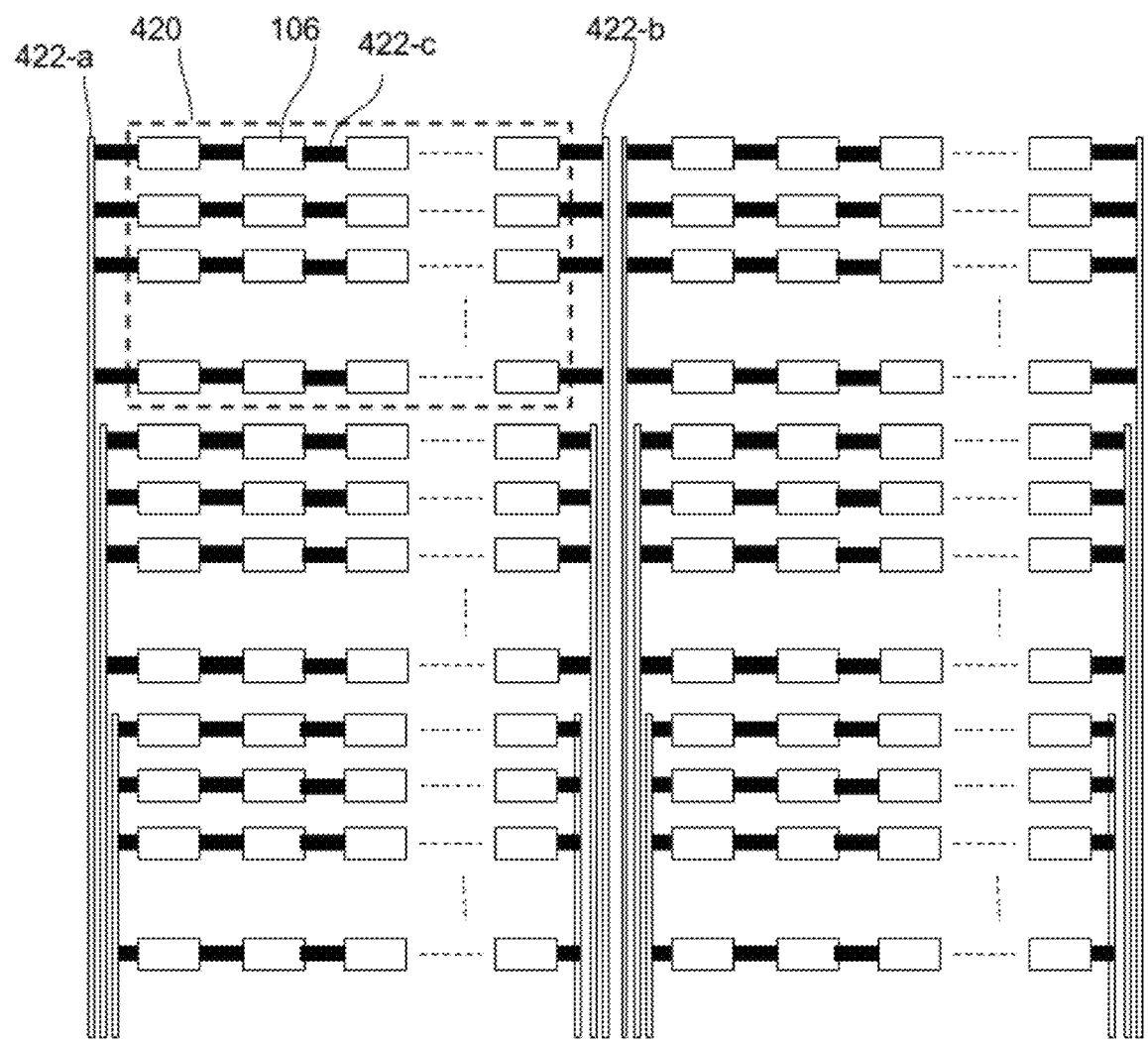
FIG. 6A shows a floor plan of local array and global array with connections for micro devices with connection on one side.
Figure 6B:
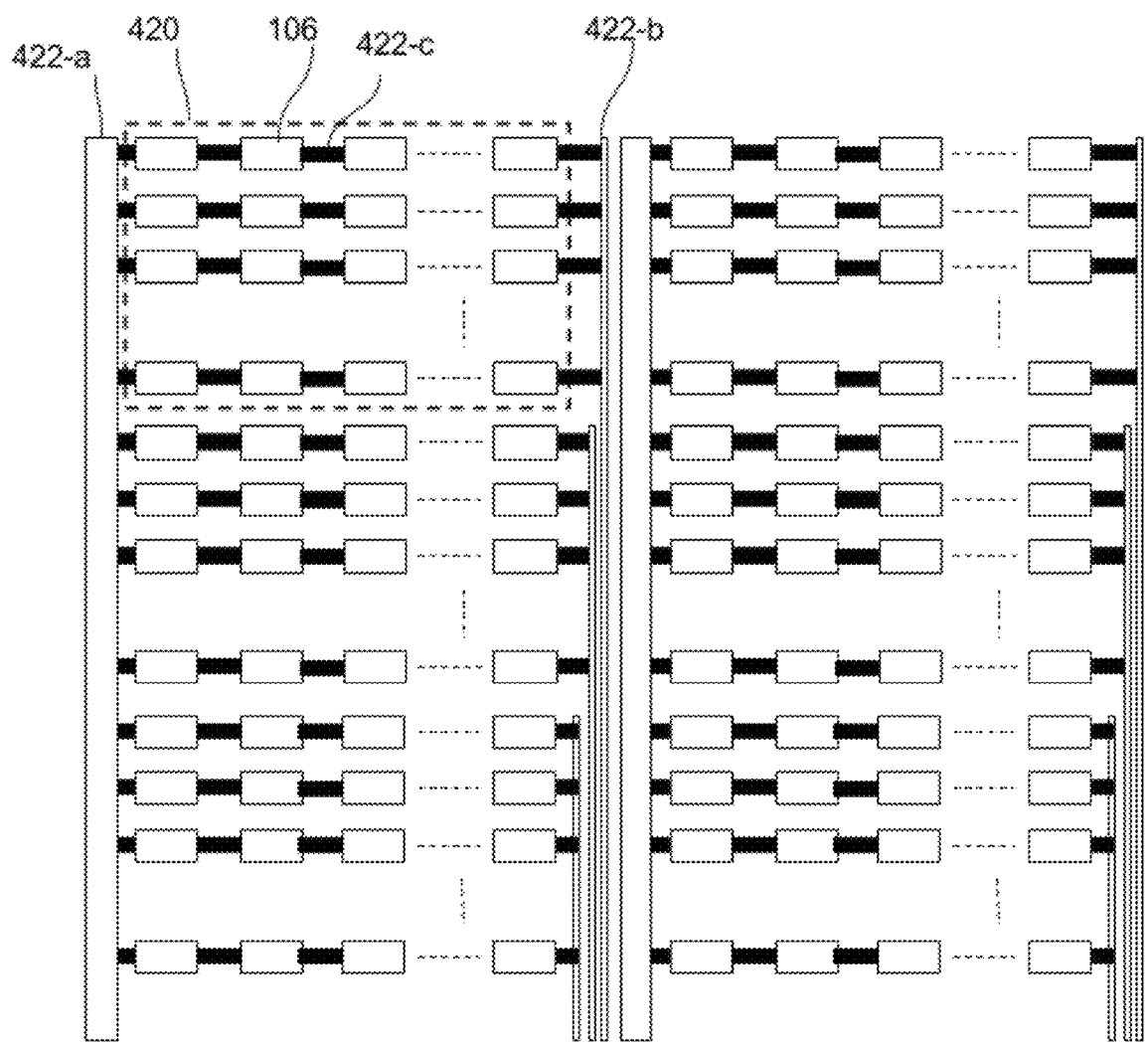
FIG. 6B shows another floor plan of local array and global array with connections and common electrode for micro devices with connection on one side.
Figure 6C:
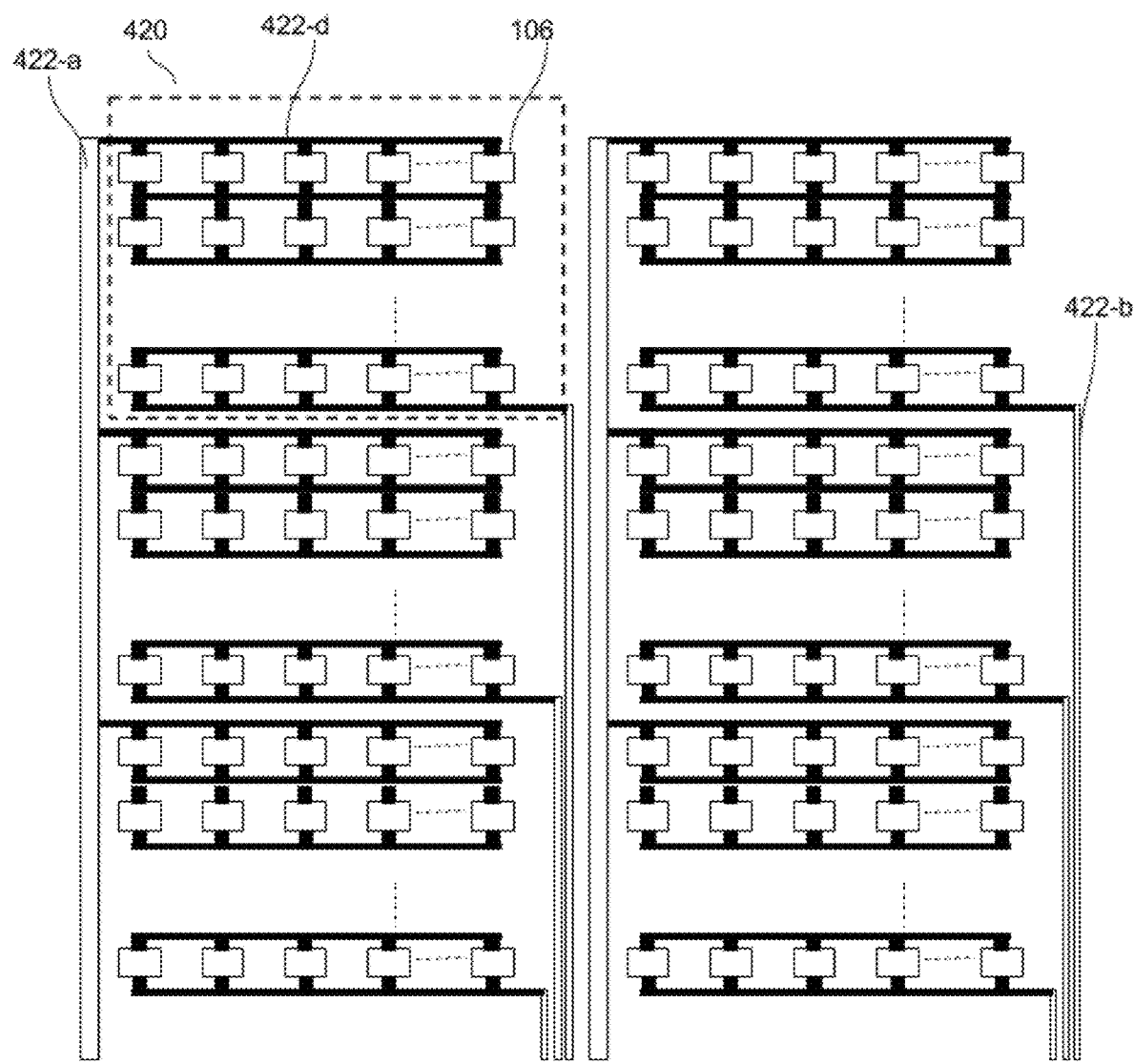
FIG. 6C shows another floor plan of local array and global array with connections and common electrode for micro devices with connection on one side.
Figure 6D:
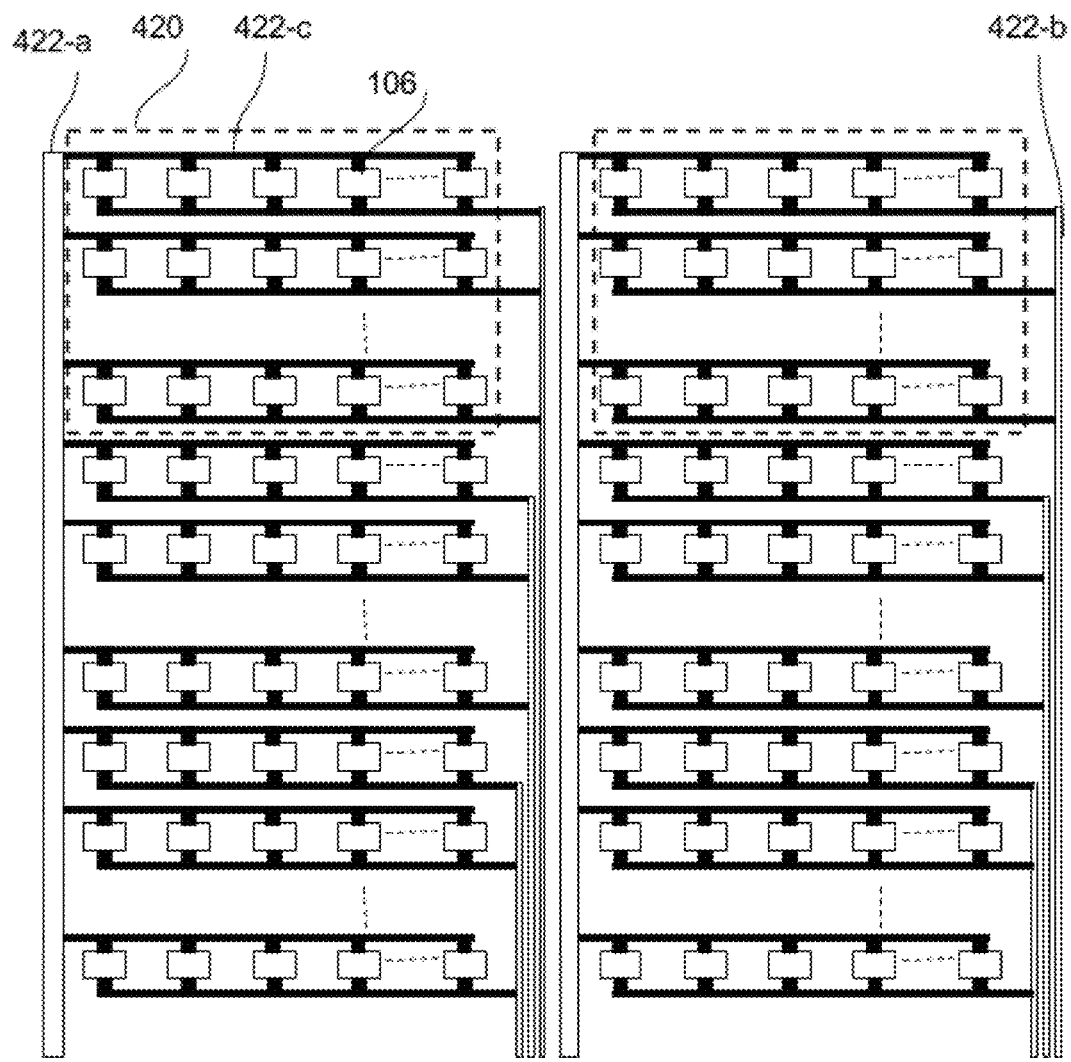
FIG. 6D shows another floor plan of local array and global array with connections and common electrode for micro devices with connection on one side.

In a structure that micro devices 106 have contact on one side, a local and/or global array structure needs to include connections to both electrodes. Here, in local array, the micro devices 106 may be connected in series or parallel. FIG. 6A illustrates a structure in which the local array is located in an integration area 420. The micro-devices 106 are formed in a series structure in the form of rows (columns) and then connected together to form a parallel structure in the form of columns (or rows). The micro-devices 106 may be connected together in series with series electrodes 422c extending therebetween, and they may be connected to a driver through common first and second electrodes 422a and 422b at opposite ends of the arrays of micro-devices 106. One of the first and second electrodes 422a or 422b may be a common electrode to multiple integration areas 420 of micro-devices 106, e.g. multiple pixels, as shown in FIG. 6B to reduce the number of traces connected to a driver. In another embodiment, the first electrode 422a may be on different side of the integration areas 420 in columns (rows) to enable sharing the common electrodes 422a between two adjacent columns (rows). FIG. 6C illustrates another exemplary embodiment for connecting the micro-devices 106 into parallel and series configuration, in which an array of micro-devices 106, i.e. a plurality of rows and columns, in an integration area 420 and interconnected by series electrodes 422c, are connected to a single second electrode 422b. A plurality of integration areas 420 are then connected to a single common first electrode 422a. FIG. 6D illustrates a full parallel structure for a localized array 420. Here, the micro devices 106 in the localized array 420 may be connected to the electrodes 422c to be all in parallel. The micro-device/electrode structures in FIGS. 6A-6D may be fabricated in one conductive layer on the substrate 100 forming all possible electrodes resulting in very low-cost process. It is possible to use single microdevices 106 for each localized array 420 as well.

Figure 7A:
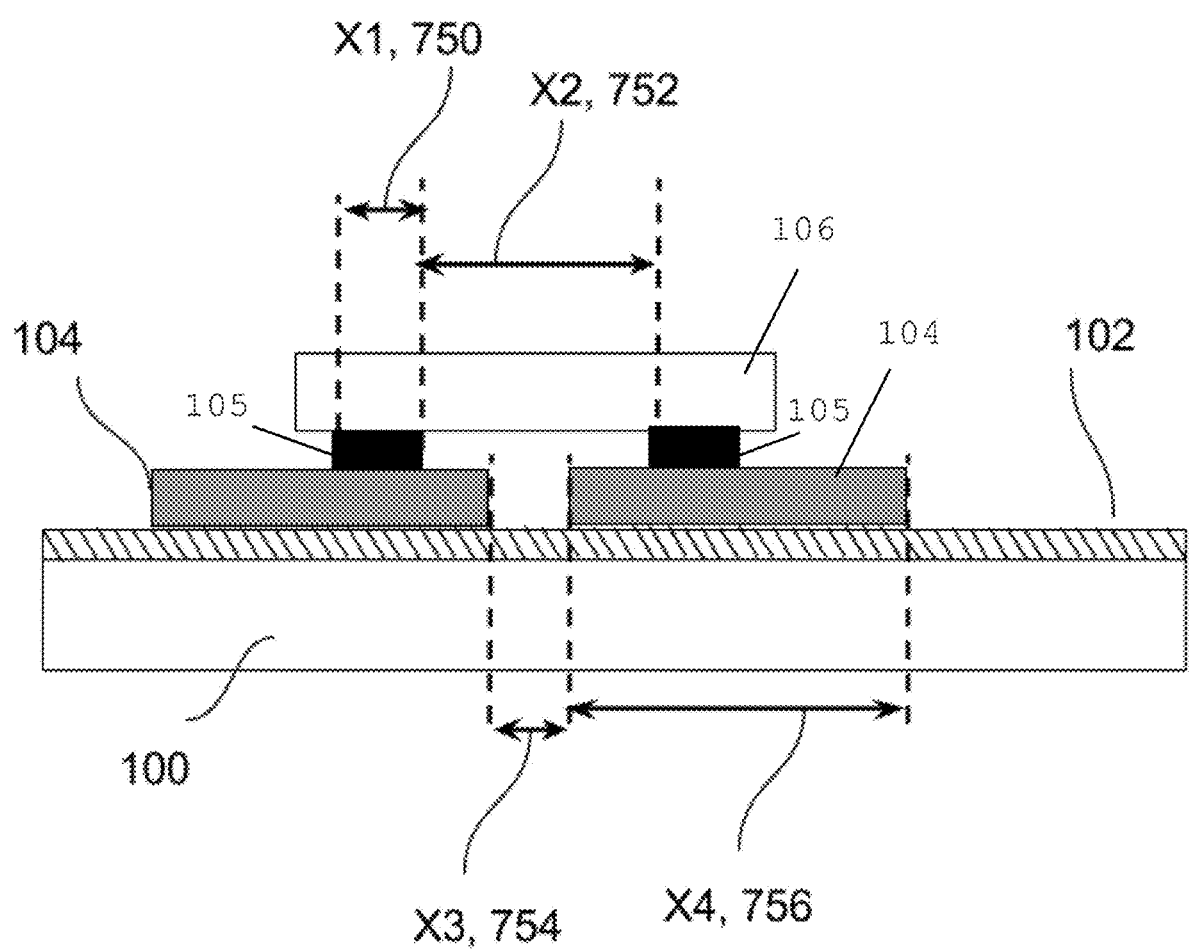
FIG. 7A shows a pad floor plan for a micro device with two pads.

FIG. 7A illustrates an embodiment in which multiple electrodes 104 and pads 105 are disposed on the receiver substrate 100 based on a two-pad micro-device 106. Similar structures may be used for multiple pads 105, each with a pad size of X1 750. The distance between the two pad locations on the receiver substrate 100 should be smaller than X2−2Dx−2Bx where X2 752 is the distance between electrode pads 105 of the micro devices 106, Dx the transfer alignment accuracy of the micro-device 106, Bx the minimum size for having a proper bonding between pads 105 on the receiver substrate 100 and on the micro devices 106.

Figure 7B:
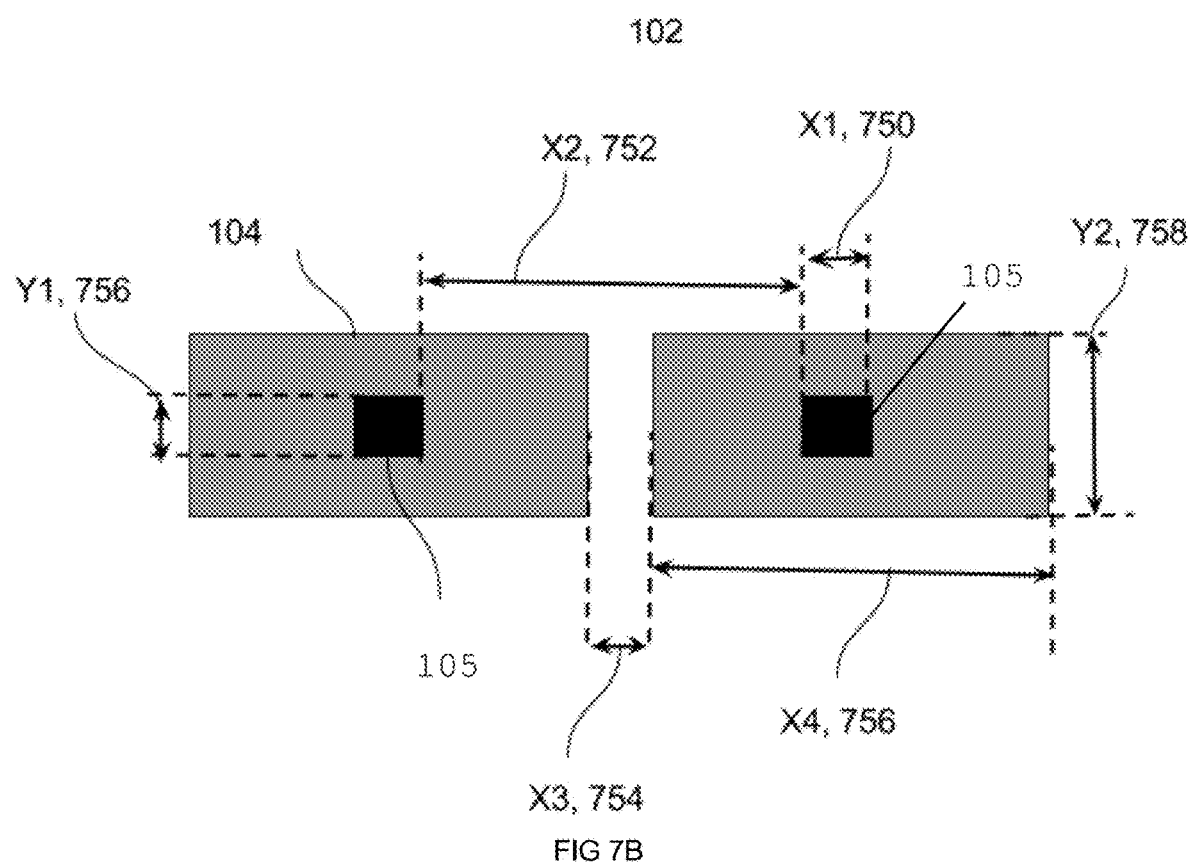
FIG. 7B shows a top view of pad floor plan for micro device with two pads.

FIG. 7B illustrates a top view of the embodiment of FIG. 7A. The size of the receiver pad 105 in the X direction is larger than X1+2Dx−Db. Here, the size of the receiver pad 105 in the Y direction is different from the X direction, i.e. should be larger than Y1+2Dy−Db, where Y1 756 is the size of the micro device pad 105 in the Y direction, Dy is the transfer alignment accuracy in the Y direction. The size of the bottom electrode 104 in the Y direction is Y2 758.

According to an embodiment for a pad design on the receiver substrate 100, the pad size is larger than the "pad size of micro devices+2x transfer alignment accuracy−minimum bonding overlap".

According to another embodiment for a pad design on the receiver substrate 100, the distance between the pads on the receiver substrate 100 is smaller than "distance between pads of a micro device−2x transfer alignment accuracy−pad size of micro device+minimum bonding overlap".

The localized arrays 420 are then connected through the common electrodes 422a to form the global array. Each localized array 420 may be controlled separately through the second controllable electrode 422b.

An embodiment of a light guide plate (LGP) 800 utilizing the integrated system in accordance with the present invention, illustrated in FIGS. 8A and 8B, comprises a backlight plate structure in which the light from one or more light sources 820 is directed in a substrate 822, which may include one or more of the following, the substrate 100, the planarization layer 108, the bottom electrode 104, the top electrode 112, and the integrated circuit layer 114. The structure is developed by depositing (or other form of forming) a reflective layer 824 on one side of the substrate 822 and an array of reflective patterns 826, e.g. circles or other suitable shape, on the other, e.g. opposite, side of the substrate 822 as shown in FIG. 8A. The pattern also may be negative image of what is shown in FIG. 8A, i.e. circular or other suitable shaped openings in FIG. 8B. In one case, the patterned reflective layer 826 may be deposited on separate substrate and laminated to the first substrate 822. This structure may be used for other embodiments described here as well.

In order to manipulate the angle of light beams inside the substrate 822, top and/or bottom sides of the substrate 822 before and/or after the metal deposition of layers 824 and 826, may be textured using mechanical or chemical methods. The textures may have a random texture or they may have certain patterns engineered to increase the efficiency of the backlight plate. The array of reflective patterns 826 may be uniform or the array of reflective patterns 826 may have a gradient depending on the position, number or distribution of the light sources, e.g. spaced farther apart when proximate the light source 820 and spaced closer together when remote from the light sources 820, as shown in FIG. 8C. In one embodiment, the light sources 820 may be LEDs installed in one side edge of the substrate 822. In addition, the substrate 822 may have any thicknesses independent of the height of the light source 820. Optical means may be used to prevent the escape of light beams when the height of the light source 820 is larger than the thickness of the substrate 822. In one case, the substrate 822 may be comprised of a flexible PEN plastic and the metallic layers 824 and 826 may be comprised of one or more of aluminum and silver deposited using sputtering or printed using screen printing systems.

Figure 9A:
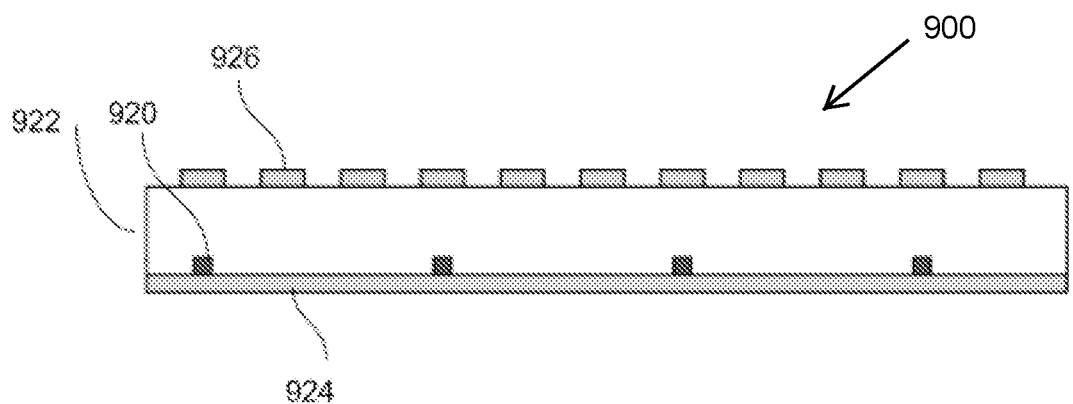
FIG. 9A shows light source sandwiched between two reflective layers with at least one being patterned.
Figure 9B:
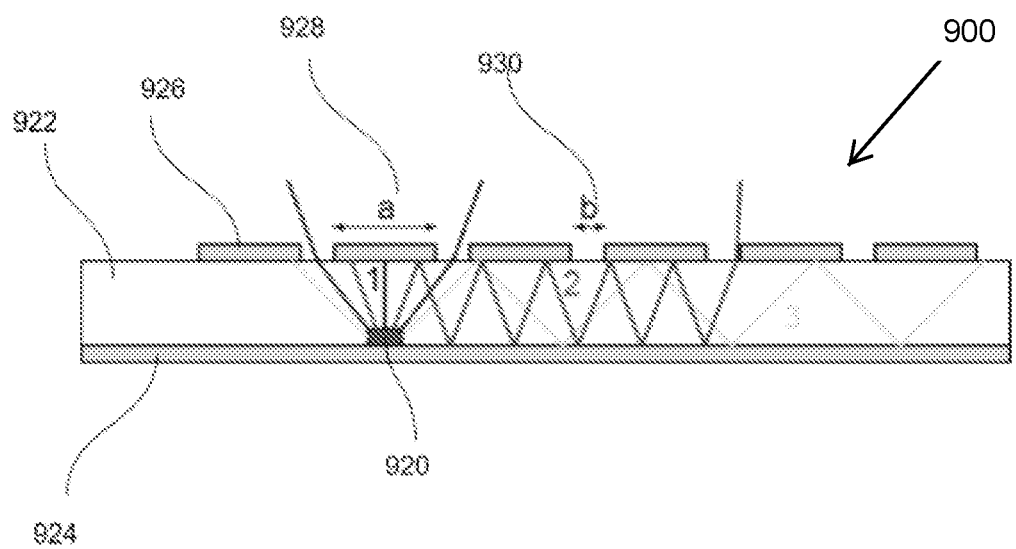
FIG. 9B shows exemplary ray tracing of the light source output in the structure of FIG. 9A.
Figure 9C:
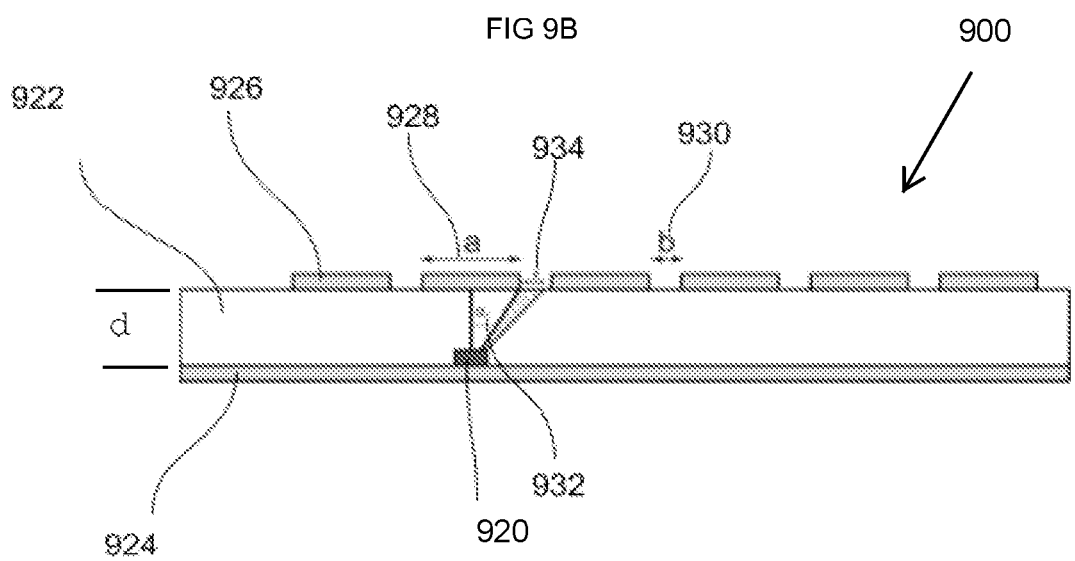
FIG. 9C shows some of the critical parameters of the structure in FIG. 9A.

According to another embodiment of the present invention, a LGP 900 illustrated in FIGS. 9A to 9C, includes light sources 920, which may be distributed on one side of a substrate 922, with the fully reflective layer 924 on one side of the substrate 922, and a partially patterned reflective layer 926 on the opposite side of the substrate 922, as shown in FIG. 9A. In this case, the light sources 920 may or may not be aligned with the reflective patterns 926 on the other side of the substrate 922. The substrate 922 may be a filling layer, e.g. dielectric, or just an air gap with spacers between the two reflective layers 924 and 926. The substrate 922 which may include one or more of the following, the substrate 100, the planarization layer 108, the bottom electrode 104, the top electrode 112, and the integrated circuit layer 114. Any of previous methods may be used here for such spacer or passivation layers. There may be another substrate on either side of the reflective layers 924 and 926. Either of reflective layers 924 and 926 may be part of either electrode for the sources 920 as well. Using this scheme, one can increase the light extraction efficiencies by distributing the light sources 920 on the surface of substrate 922 of the reflective layer 924, instead of using an edge-lit scheme.

FIG. 9B illustrates an example of beam ray propagation of the aforementioned embodiment. The pattern reflective layers 926 may be negative image of what is shown, i.e. with a reflective sheet with transparent openings, instead of transparent spaces between reflective shapes. Also, the pattern 926 may have a different profile, such as gradient around the light source 920, to compensate for the light non-uniformity caused by individual point source devices. On top of the LGP 900, e.g. any layer 922 or 926, there may be other structures, such as a color conversion layer deposit, laminated or stacked thereon. In one embodiment, a color conversion layer may be disposed on each light source 920. As an example, assuming smooth surfaces and interfaces, positioning of the metallic patterns 926 may be optimized for 1) maximum extraction of the lights from the individual light sources 920 and 2) propagation of the light across the substrate 920 for uniform illumination.

In an example calculation, both top and bottom surfaces/interfaces of the substrate 922 are assumed to be smooth. Depending on a dimension "a" 928 of a shape in the reflective pattern 926, a dimension "b" 930 of a transparent opening in the reflective pattern 926, and a light beam angle α 932, beams with angles larger than minimum angle $\alpha_1$ to avoid the closest reflective pattern a, but less than a critical angle $\alpha_c$ of light exiting light source 920, will exit the light guide plate (LGP) 900 from the nearest opening x 934.

Accordingly, the critical distance for escaping light
$x = d \times \tan(\alpha_c) - (a/2)$ OR $\tan(\alpha_c) = (a/2 + x)/d$ The minimum angle for escaping light is defined by
$\tan(\alpha_1) = (a/2)/d$ And the beam angle relating to the critical distance x 934 is the critical angle minus the minimum angle or $\alpha_x = \alpha_c - \alpha_1$ If $x > b$ the beam angle relating to escaping light will be less than the critical distance x, whereby the escaping angle will be $\alpha_x = \tan^{-1}(a/2 + b)/d) - \tan^{-1}(a/2d)$ In an ideal case, any beam with angles greater than the critical angle $\alpha_c$ or the escape angle $\alpha_x$ when x>b, will be trapped inside the LGP 900, e.g. beam 3 in FIG. 9C. Beams with angles less than $\alpha_c$ will exit the LGP 900 either through the nearest opening 934 or the subsequent openings depending on the launch angles, the reflective pattern dimension "a" 928, and the gap dimension "b" 930.

Texturizing the bottom reflective surface or/and the top surface of the substrate 922 optimizes the propagation of light, and results in uniform light beam extraction in the areas between two adjacent light sources 920. In another embodiment instead of texturing the top surface of the substrate 922 of the LGP 900 shown in FIG. 5 before pattern deposition, this process may be performed after pattern formation. Consequently, only areas denoted by "b" are texturized. In another embodiment, the top surface of the substrate 922 may be texturized after pattern deposition of the patterned reflective layer 926, and the bottom surface of the substrate 922 may be textured before metal blanket deposition of the reflective layer 924.

Figure 10A:
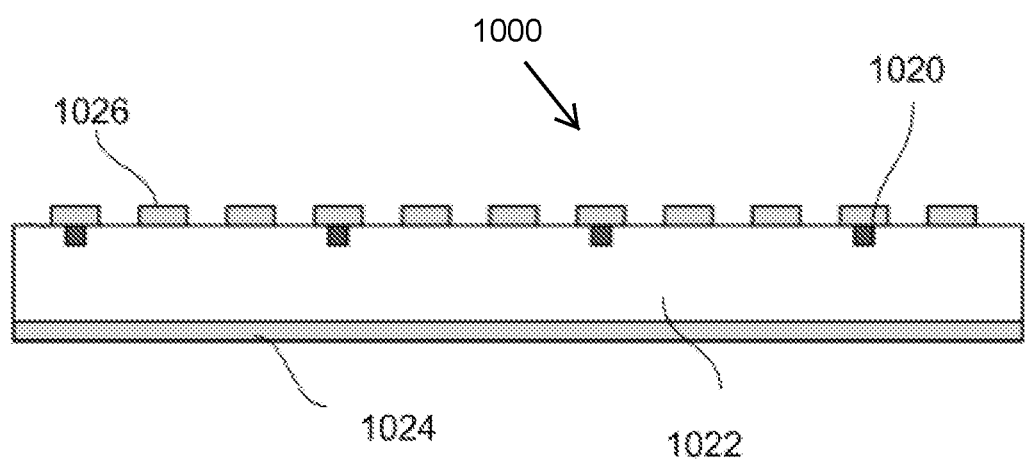
FIG. 10A shows an embodiment for a light source sandwiched between reflective layers to create a uniform surface emitting light source.

In another embodiment, as shown in FIG. 10A, an LGP 1000 includes light sources 1020, which may be positioned on a top surface of a substrate 1022, underneath of reflective patterns 1026 and on an opposite side to the reflective layer 1024.

Figure 10B:
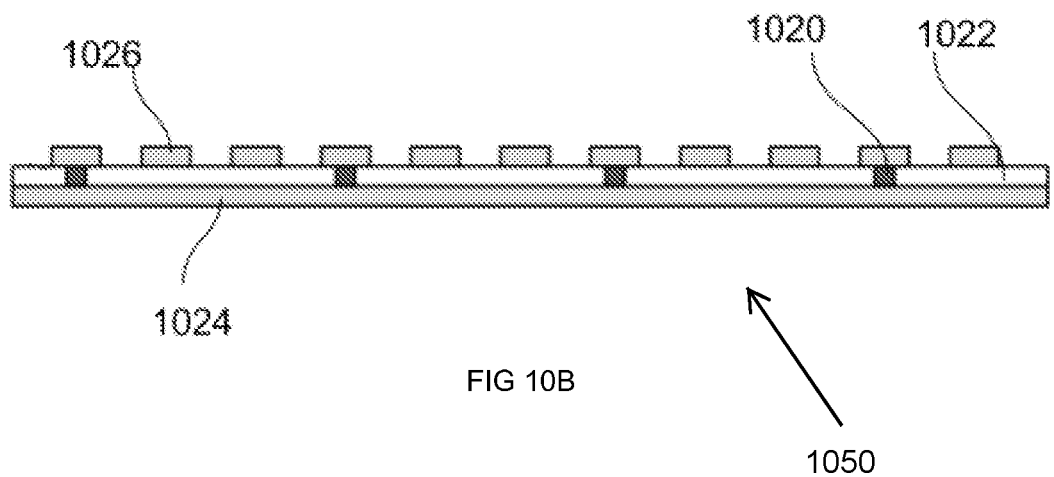
FIG. 10B shows another embodiment for a light source sandwiched between reflective layers to create a uniform surface emitting light source.

In another embodiment, shown in FIG. 10B, an LGP 1050 includes a height, which is the same as the height of the light sources 1020 or the light sources 1020 are installed in holes embedded into the substrate 1022, which may include one or more of the following, the substrate 100, the planarization layer 108, the bottom electrode 104, the top electrode 112, and the integrated circuit layer 114. In this scheme, the light beams come from the side of the light source 1020. In the case of LED light sources, the top and bottom reflectors layer 1026 and 1024 may be part of electrodes for the LED contacts as well. Similar to other embodiments, top and bottom surfaces of the substrate 1022 may be texturized before or after metal deposition of the reflective layers 1024 and 1026. In this example a dent (or a hole) is made in the substrate 1022 and after placing LEDs 1020, they are secured in place by epoxy or other means of curable materials.

Figure 11A:
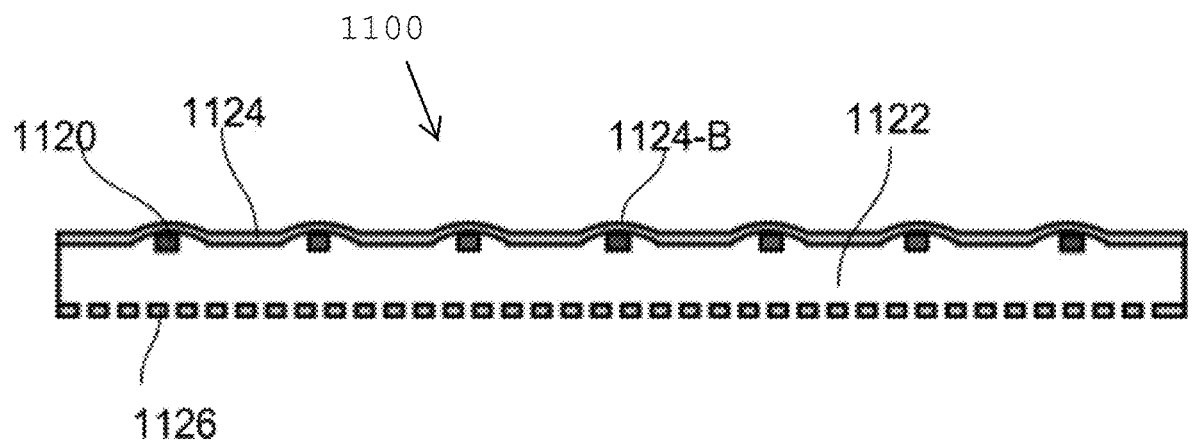
FIG. 11A shows another embodiment for a light source sandwiched between reflective layers to create a uniform surface emitting light source.

In another embodiment the top surface of a substrate 1122 may have concave or convex mirror structures to further enhance the uniform light extraction from a LGP unit 1100. As shown in FIG. 11A, each LED 1120 is placed between the focal point (F) of a concave structure 1124-B and the mirror 1124. The concave structures 1124-B additionally facilitates the light propagation along the LGP 1100. In this case the LED's 1120 may be on top or bottom side of the substrate 1122, i.e. proximate either reflective layer 1124 or 1126, depending on the light source height and the overall thickness of the LGP 1100.

Figure 11B:
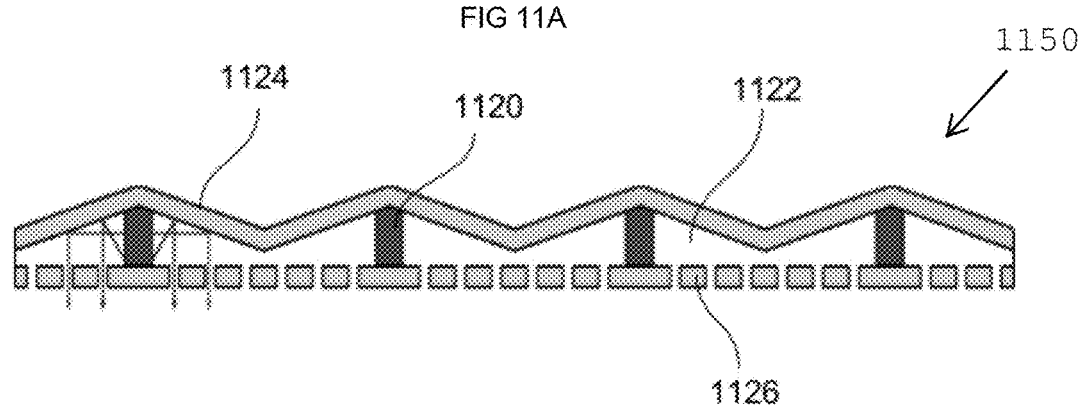
FIG. 11B shows another embodiment for a light source sandwiched between reflective layers to create a uniform surface emitting light source.

In another embodiment, illustrated in FIG. 11B, the height of the light source 1120 is comparable with that of the LGP 1150, i.e. substantially the same as the substrate 1122, whereby pyramid concave mirrors 1120-2 may be provided in the top or bottom reflective layers 1124 or 1126 to guide side-illuminating light toward the bottom or top perforated plate (FIG. 11B).

Figure 11C:
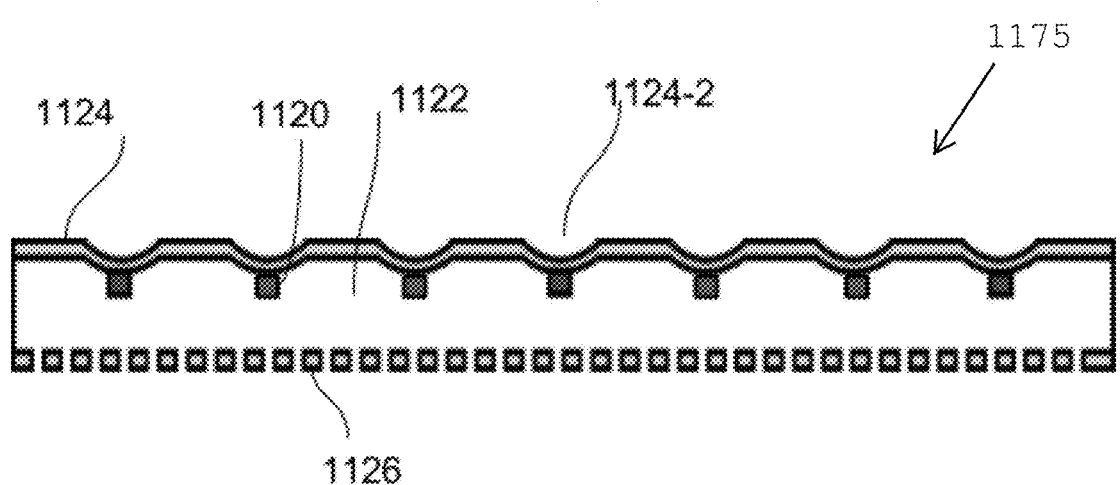
FIG. 11C shows another embodiment for a light source sandwiched between reflective layers to create a uniform surface emitting light source.

FIG. 11C illustrates another embodiment, in which an LGP 1175 includes light source 1120 embedded inside the substrate 1122, which has been modified for receiving convex mirror structures 1126-2. The substrate 1122 may include one or more of the following, the substrate 100, the planarization layer 108, the bottom electrode 104, the top electrode 112, and the integrated circuit layer 114. The convex structures 1126-2 may decrease the total number of light sources 1120 required in the backlight units, while maintaining a particular uniform light intensity. In all above-mentioned examples, careful calculations will be done to find the optimum curvature of the convex or concave mirrors 1124-B and 1124-2 for uniform light radiation from the backlight unit. In addition, optical micro lenses may be provided between two adjacent top reflectors to further enhance the light propagation.

In the embodiments of FIG. 9A-C, FIG. 10A-B, FIG. 10A-C, either of the reflective layers 924/926, 1024/1026, 1124/1126 may be part of the electrode for the light sources 920, 1020, 1120. A transparent electrode may be deposited on or before the patterned reflective layer 926, 1026, 1126. In the embodiments of 9A-C, FIG. 10A-B, and FIG. 10A-C, substrates with other structure, such as electrodes, color conversion layers, and other layers may be provided before or after any of reflective layers. In the embodiments of 9A-C, FIG. 10A-B, and FIG. 10A-C, the substrate 922, 1022, 1122 may be a filler layer, or just space between the two reflective layers. The filler may have particles with reflective characteristics to improve the light output uniformity. In the embodiments of 9A-C, FIG. 10A-B, and FIG. 10A-C, the patterned reflective layers may have a profile, such as a gradient around the point light source to create uniform light output with fewer light sources.

In the embodiments of FIG. 9A-C, FIG. 10A-D the light sources 920 may or may not be aligned with the reflective patterns 926 on the other side of the substrate 922. The substrate 922 may be a filler layer or just a space between two reflective layers 924, 926. Any of previous methods may be used for the spacer or passivation layers. There may be another substrate on either side of the reflective layers 924 926. Either of reflective layers 924 926 may be part of the either electrodes for the source.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An integrated system connecting electrodes to micro-devices comprising:
   a substrate;
   a micro-device array having a plurality of micro-devices transferred on top of the substrate;
   a planarization layer surrounding the plurality of micro-devices, the planarization layer including individual openings on top of and for each micro-device;
   a backplane including an integrated circuit layer and a patterned electrode system, wherein the patterned electrode system includes formed individual top electrodes disposed in the individual openings to directly connect each micro-device to the integrated circuit layer; and
   a first reflective layer on one side of the planarization layer; and
   a second patterned reflective layer, including reflective portions and transparent portions, on another side of the planarizing layer,
   wherein the second patterned reflective layer has a gradient depending on a position, a number or a distribution of light sources.

2. The integrated system according to claim 1, wherein the first fully reflective layer comprises a common bottom electrode.

3. The integrated system according to claim 1, wherein the first fully reflective layer includes concave structures for receiving each micro-device to facilitate light propagation.

4. The integrated system according to claim 1, wherein the first fully reflective layer includes convex structures adjacent each micro-device to facilitate light propagation.

5. The integrated system according to claim 1, wherein the first fully reflective layer includes pyramidal structures for receiving each micro-device to facilitate light propagation.

6. The integrated system according to claim 1, wherein the second patterned reflective layer comprises a patterned electrode system.

7. The integrated system according to claim 1, wherein the second patterned reflective layer is textured.

8. The integrated system according to claim 1, wherein top and/or bottom sides of the substrate before and/or after the metal deposition of the first reflective and the second patterned reflective layer, are textured using mechanical or chemical methods, are textured.

9. The integrated system according to claim 1, wherein light sources are LEDs installed in one side edge of the substrate and the substrate has a thicknesses independent of the height of the light source.

10. The integrated system according to claim 9, wherein optical means is used to prevent the escape of light beams when the height of the light source is larger than the thickness of the substrate.

* * * * *